United States Patent
Amali et al.

(10) Patent No.: US 7,397,083 B2
(45) Date of Patent: Jul. 8, 2008

(54) TRENCH FET WITH SELF ALIGNED SOURCE AND CONTACT

(75) Inventors: Adam I Amali, Hawthorne, CA (US); Naresh Thapar, Redondo Beach, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 11/982,815

(22) Filed: Nov. 5, 2007

(65) Prior Publication Data
US 2008/0061365 A1  Mar. 13, 2008

Related U.S. Application Data

(60) Division of application No. 11/376,057, filed on Mar. 15, 2006, now Pat. No. 7,301,200, which is a continuation of application No. 10/234,303, filed on Aug. 30, 2002, now Pat. No. 7,045,859.

(60) Provisional application No. 60/317,516, filed on Sep. 5, 2001.

(51) Int. Cl.
*H01L 29/76* (2006.01)

(52) U.S. Cl. ............... 257/331; 257/409; 257/488; 257/E29.26; 257/E29.009

(58) Field of Classification Search ......... 257/330–334, 257/409, 488, E29.257, E29.26, E29.009
See application file for complete search history.

(56) References Cited

U.S. PATENT DOCUMENTS

| | | |
|---|---|---|
| 4,767,722 A | 8/1988 | Blanchard |
| 5,298,442 A | 3/1994 | Bulucea et al. |
| 5,614,751 A | 3/1997 | Yilmaz et al. |
| 5,744,386 A | 4/1998 | Kenney |
| 5,910,669 A | 6/1999 | Chang et al. |
| 5,998,835 A | 12/1999 | Furukawa et al. |
| 6,001,678 A | 12/1999 | Takahashi |
| 6,163,052 A | 12/2000 | Liu et al. |
| 6,180,981 B1 * | 1/2001 | Kinzer et al. ............... 257/339 |
| 6,188,104 B1 | 2/2001 | Choi et al. |
| 6,194,741 B1 | 2/2001 | Kinzer et al. |

(Continued)

FOREIGN PATENT DOCUMENTS

JP   11-031815   2/1999

OTHER PUBLICATIONS

Wolf, S., Silicon Processing for the VLSI Era, vol. 3—the Submicron MOSFET, Lattice Press, 1995, pp. 386-373.

(Continued)

*Primary Examiner*—Tuan N. Quach
(74) *Attorney, Agent, or Firm*—Ostrolenk, Faber, Gerb & Soffen, LLP

(57) ABSTRACT

A trench type power MOSgated device has a plurality of spaced trenches lined with oxide and filled with conductive polysilicon. The tops of the polysilicon fillers are below the top silicon surface and are capped with a deposited oxide the top of which is flush with the top of the silicon. Source regions of short lateral extent extend into the trench walls to a depth below the top of the polysilicon. A trench termination is formed having an insulation oxide liner covered by a polysilicon layer, covered in turn by a deposited oxide.

5 Claims, 6 Drawing Sheets

U.S. PATENT DOCUMENTS

| | | | |
|---|---|---|---|
| 6,236,099 B1 | 5/2001 | Boden, Jr. | |
| 6,297,101 B1 | 10/2001 | Schaeffer | |
| 6,309,929 B1 * | 10/2001 | Hsu et al. | 438/270 |
| 6,331,466 B1 | 12/2001 | Takahashi et al. | |
| 6,351,018 B1 | 2/2002 | Sapp | |
| 6,413,822 B2 | 7/2002 | Williams et al. | |
| 6,437,386 B1 | 8/2002 | Hurst et al. | |
| 6,534,365 B2 | 3/2003 | Kim et al. | |
| 6,538,280 B2 | 3/2003 | Nakamura | |
| 6,977,208 B2 * | 12/2005 | Chiola | 438/570 |
| 6,987,305 B2 * | 1/2006 | He et al. | 257/417 |
| 7,202,525 B2 * | 4/2007 | Kinzer | 257/330 |
| 2002/0167046 A1 | 11/2002 | Aoki et al. | |
| 2007/0145514 A1 * | 6/2007 | Kocon | 257/488 |

OTHER PUBLICATIONS

Wolf, S., et al., Silicon Processing for the VLSI Era, vol. 1—Process Technology, First Edition, Lattice Press, 1986, p. 124.

Wolf, S. et al., Silicon Processing for the VLSI Era, vol. 1—Process Technology, Second Edition, Lattice Press, 200-. p. 1.

B. Jayant Baliga, "Power Devices", Chapter 4 in "Modern Semiconductor Device Physics," S.M. Sze edited, John Wiley & Sons, 1998, pp. 183-185, 211, 215, 217.

* cited by examiner

TRENCH FET WITH SELF ALIGNED SOURCE AND CONTACT

RELATED APPLICATION

This application is a division of U.S. patent application Ser. No. 11/376,057, filed Mar. 15, 2006, now U.S. Pat. No. 7,301,200 entitled TRENCH FET WITH SELF ALIGNED SOURCE AND CONTACT which is a division of U.S. patent application Ser. No. 10/234,303, filed Aug. 30, 2002, now U.S. Pat. No. 7,045,859 entitled TRENCH FET WITH SELF ALIGNED SOURCE AND CONTACT which claims the benefit of U.S. Provisional Application No. 60/317,516, filed Sep. 5, 2001 to which a claim of priority is hereby made.

FIELD OF THE INVENTION

This invention relates to power MOSFETs and more specifically relates to a novel structure and manufacturing process for low voltage trench type MOSFETs.

BACKGROUND OF THE INVENTION

Low voltage trench type MOSFETs are well known. In present day devices, the manufacture process is complicated due to the contact etch and the use of shallow implants. Thus, with regard to the contact etch, problems exist of an incomplete silicon etch and metal step coverage and incomplete filling of the trench. Further, shallow implants into deep contacts introduces defects which reduce the $BV_{dss}$ of the device.

Further, in low voltage trench MOSFETs, the on resistance ($R_{DSON}$) is highly dependent on the channel contribution, which is greater than 40% of the total $R_{DSON}$. Thus, an increase in channel density and a reduction in channel length is desirable to reduce $R_{DSON}$. However, increasing cell density produces complications in the design of the device and the manufacturing process.

Further, in the manufacturing process, each of the trenches are filled with a conductive polysilicon gate mass and capped with an oxide which insulates the source electrode from the polysilicon gate. This oxide is conventionally a grown oxide. It has been found that manufacturing problems occur as result of the grown oxide cap.

It would be desirable to reduce the manufacturing complexity and to also reduce the $R_{DSON}$ of trench type low voltage MOSFETs.

BRIEF DESCRIPTION OF THE INVENTION

In accordance with the invention a novel process and device structure is provided which employs:

- a thickened bottom oxide in the trenches;
- a simplified current flow path;
- no source in the termination region;
- no contact etch into the silicon (to eliminate a critical source alignment and metal step coverage problems).
- a deposited oxide cap over the tops of the polysilicon gates in the trenches.

Further, in accordance with the invention and in the active area, the source/gate overlap is defined only by diffusions, and the gate oxide layers in the trenches are shielded from the polysilicon etch plasma and from source implant damage.

In accordance with a significant feature of the invention, the oxide used to cap the conductive polysilicon gates in the trenches is a deposited rather then a grown oxide.

The resulting structure has a reduced manufacturing complexity, a lower $R_{DSON}$; a smaller die size for the same current, and improved manufacturing yield.

DETAILED DESCRIPTION OF THE PREFERRED EMBODIMENTS

Figure 1:
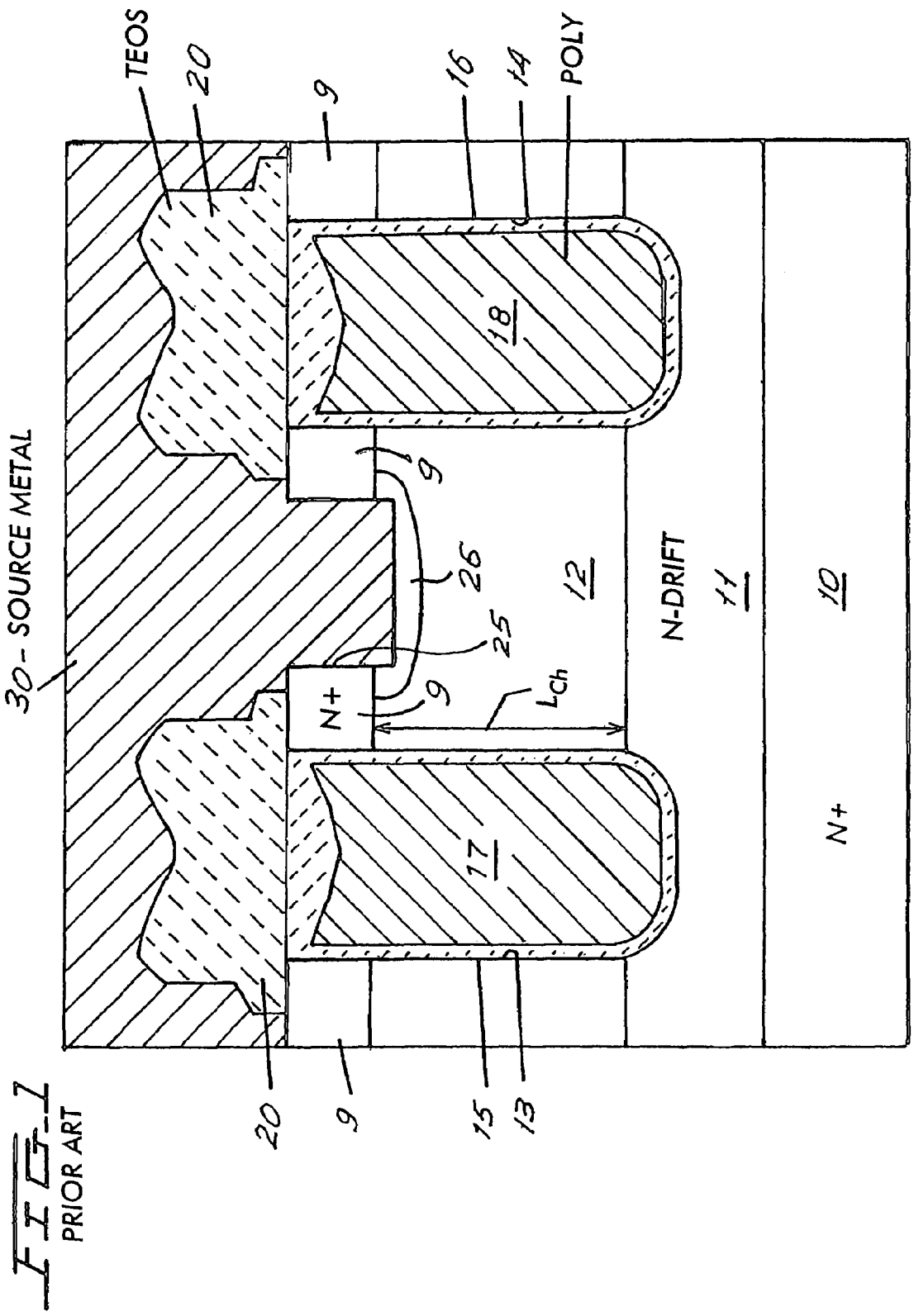
FIG. 1 is a cross-section of a small portion of the active area of a prior art device with a grown oxide capping the polysilicon gates.
Figure 2:
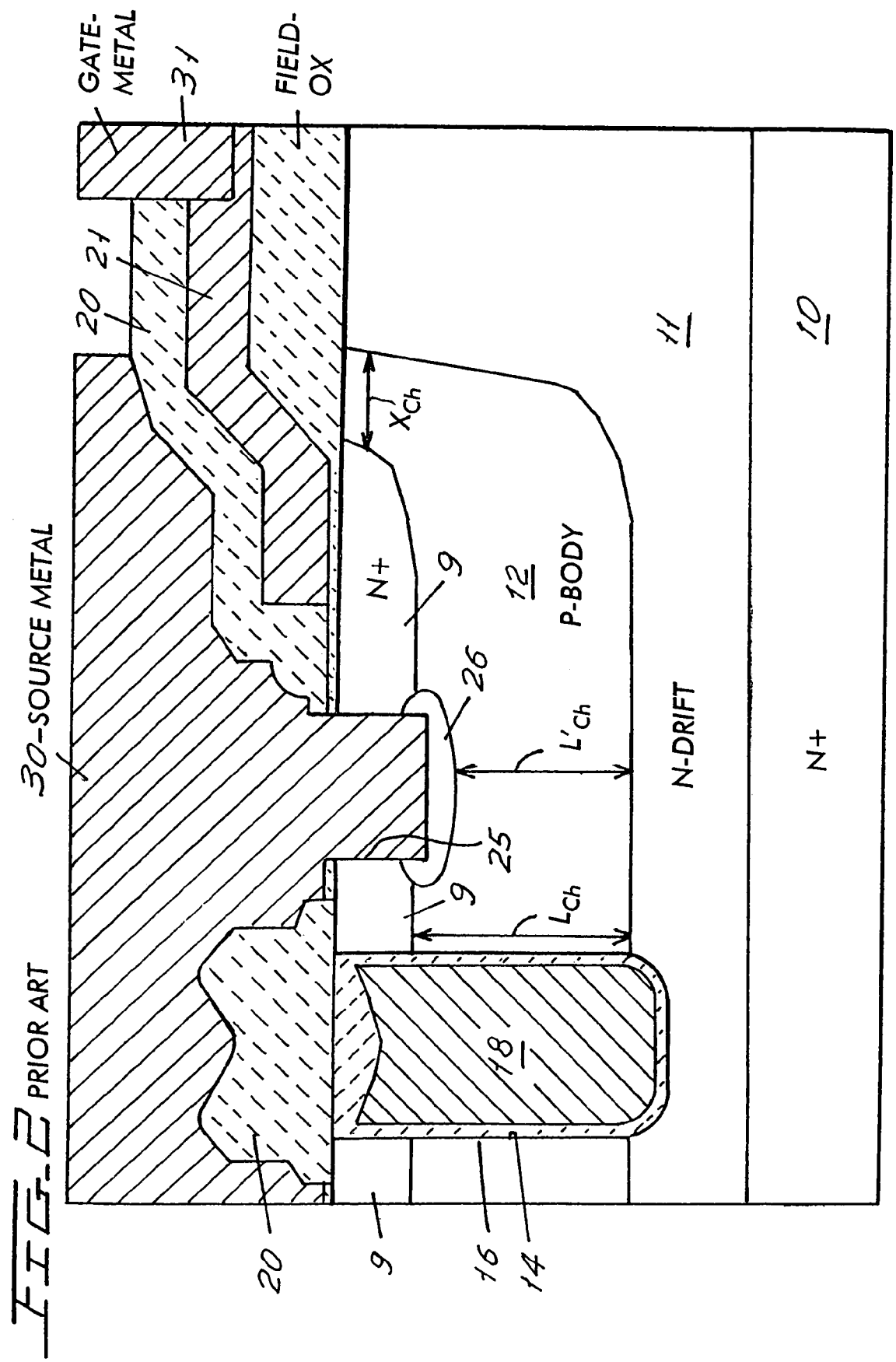
FIG. 2 is a cross-section of a small portion of the termination region of the prior art device of FIG. 1.

Referring first to FIGS. 1 and 2, there is shown a known trench MOSFET. Thus, there is shown an N⁺ substrate 10. Substrate 10 contains a drain electrode on its bottom, not shown, and has an epitaxially grown N⁻ drift layer 11 grown thereon.

A P type body diffusion 12 is formed in N⁻ drift region 11, and an N⁺ source layer 9 is diffused into region 12. Trenches 13, 14 are etched into the P body 12 and are lined with a gate oxide 15, 16 respectively and are filled with conductive polysilicon gates 17, 18 respectively. The tops of polysilicon regions 17, 18 were topped with thermally grown oxide caps and are covered by a TEOS insulation layer 20. A gate electrode 21 (FIG. 2) is connected to all polysilicon elements 17, 18 (connection not shown).

A contact trench 25 is formed as shown and a P⁺ contact diffusion 26 is formed at the bottom of the trenches 25. Finally, a source metal 30 is deposited atop the wafer and is separated to also define a gate metal contact 31 (FIG. 2) which contacts gate electrode 21. The grown oxide cap atop polysilicon 17 and 18 insulated polysilicon 17 and 18 from source metal 30. This grown oxide cap has been a source of failure.

The structure shown provides a lateral channel of dimension $X_{ch}$; an effective channel of length $L^1_{ch}$; and channel of length $L_{ch}$ (FIG. 2).

In operation, the breakdown voltage of the device is limited by the lengths channels $X_{ch}$ and $L^1_{ch}$; by the contact etch; and by the need for the shallow N⁺ and P⁺ implants 25 and 26 respectively.

Further, the channel length $L_{ch}$ is appreciably greater than the maximum depletion width because of limitations imposed on the breakdown voltage BV by the contact manufacturing sequence. Contact alignment is a critical process parameter, and metal step coverage is a problem.

Figure 3:
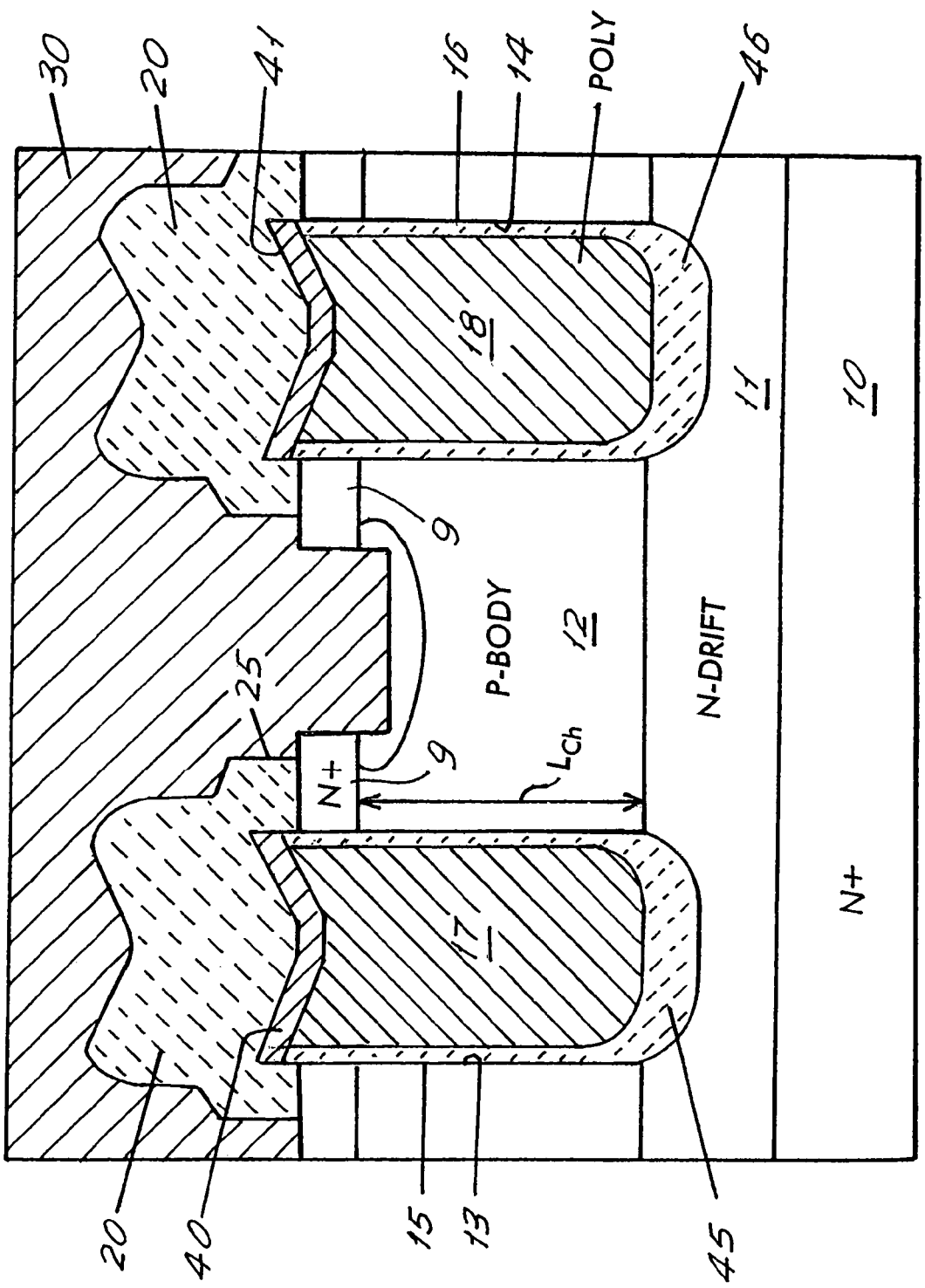
FIG. 3 is a cross-section of FIG. 1 with a silicide on the gate polysilicon.

FIG. 3 shows one improvement of the device of FIGS. 1 and 2 in which the top of the polysilicon trench fillers 17 and 18 are covered by metal silicide layers 40, 41 respectively which reduces the effective lateral gate resistance to a gate terminal. No other insulation is disposed between the oxide caps 20 and the metal silicide layers 40, 41, and the oxide caps 20 extend over the metal silicide layers 40, 41 and at least a portion of source layers 9. Further, the gate oxide 15, 16 is caused to be thickened at the bottoms 45 and 46 of trenches 13 and 14, respectively. Still further, in FIG. 3, a thicker hard-mask is used, and the recess at the center of polysilicon fillers does not reach below the hard mask. Also, in FIG. 3, the source/gate overlap which determines the device $Q_g$ is defined only by diffusions. Each source layer 9 is overlapped entirely by a respective polysilicon gate electrode 17, 18. Finally, the gate oxide 15, 16 is shielded from the polysilicon etch plasma and from source implant plasma.

Figure 4:
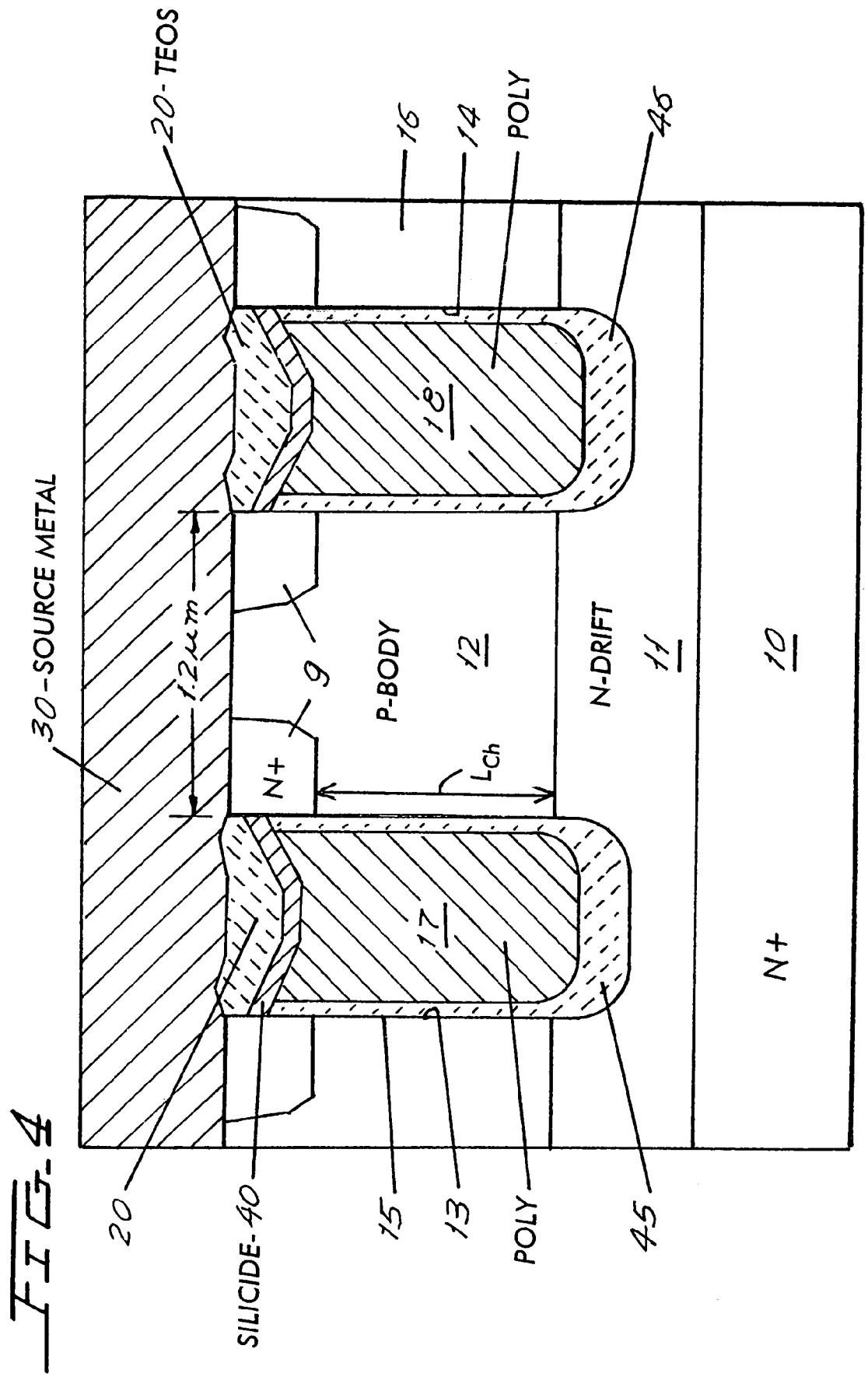
FIG. 4 is a cross-section like that of FIG. 1, with the features of the present invention including a deposited capping oxide on the polysilicon in the trenches.
Figure 5:
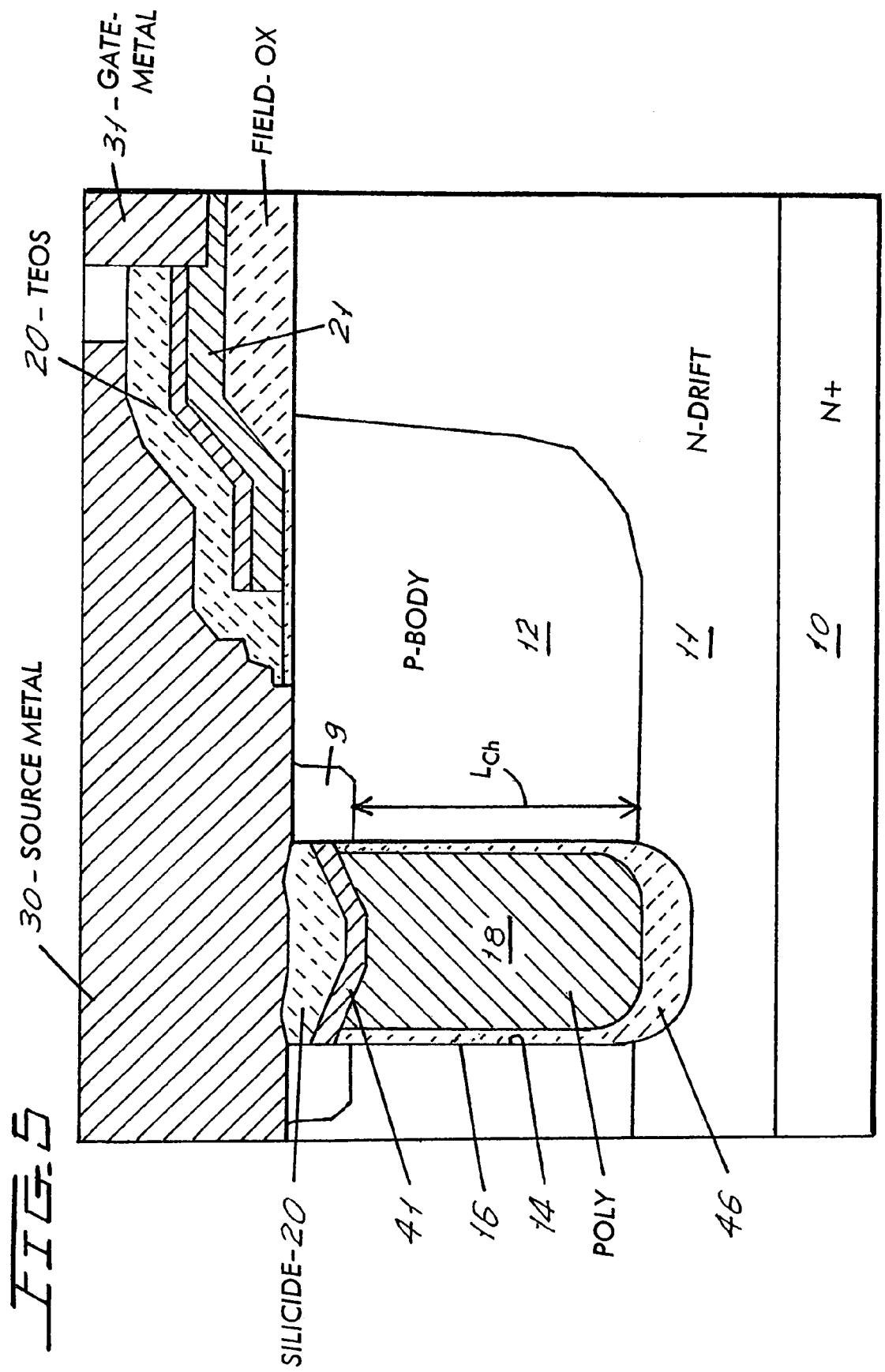
FIG. 5 is a cross-section of the termination region for the device of FIG. 4.

FIGS. 4 and 5 show the modified structure and process included in the present invention. It will be noted that the thickened bottom oxides 45 and 46 are used, as is the silicided gate elements 40 and 41 (which are eliminated in FIG. 6). Further, however, the source 9 does not extend into the termination (FIG. 5), and there is no contact etch into the silicon (avoiding critical source alignment and metal step coverage issues). Further, a simplified current flow path is provided.

Significantly, the oxide cap 20 above the polysilicon 17 and 18 (the silicide layer 40, 41 may be removed) is a deposited oxide, preferably LD TEOS having a thickness of 4000 Å and etched back to be approximately flush with the silicon surface. Again, no other insulation is disposed between the oxide cap 20 and the silicide layer 40, 41. The oxide cap 20 does not extend over the source 9.

One process which has been used to make a device of the present invention employed the following basic steps:

1. A pad oxide grown atop the surface of an N⁻ drift region (region 11 of FIGS. 4 and 5) of a semiconductor wafer or chip to a thickness of about 240 Å.

2. A P type channel implant is formed into the top of the N⁻ drift region 11.

3. Nitride is deposited atop the P type channel implant to a thickness of about 1200 Å-3500 Å.

4. An active mask is formed atop the device surface and a termination trench (not shown in FIGS. 1 to 5 but shown in FIG. 6) may be formed to a depth of 0.7 microns.

5. A channel drive, to drive the P implant is carried out at about 1100° C. for about 30 minutes forming P channel region 12.

6. A field oxidation step is carried out, forming an oxide to a thickness of about 5000 Å.

7. An active area trench mask is formed to etch trenches 17, 18 to a depth of 1.1 micron and a width of 0.4 micron. Other trench dimensions may be used.

8. A sacrificial oxide (450 Å) and etch is then carried out.

9. A pad oxide of 240 Å is then grown, followed by a gate nitride deposition over the walls of the trenches and over the top mesa surfaces between the walls.

10. A dry nitride etch then removes the nitride from the trench bottoms.

11. An oxide 45 is then grown in the trench bottoms to 2000 Å.

12. The nitride on the vertical trench walls is removed by a wet nitride etch.

13. The cleared trench walls then receive a grown gate oxide (15, 16).

14. Polysilicon is next deposited over the wafer and into the trenches to a thickness of 5000 Å.

15. A POCl deposition then takes place and is driven to make polysilicon masses 17 and 18 conductive.

16. The polysilicon is then etched, forming a recess below the silicon surface about 0.15 microns deep (±0.1 micron).

17. Next a polyoxide is formed to about 450 Å.

18. An oxide on nitride etch is then carried out, and nitride is pulled back laterally by about 1000 Å to clear the corners of the mesas between trenches for a source implant.

19. Following an AME oxide etch, an arsenic source implant is carried out, for forming the N⁺ source regions 9.

20. Thereafter, and in accordance with an important feature of the invention, a low density TEOS deposition is carried out to a thickness of about 4000 Å to form the oxide plugs 20 in FIGS. 4 and 5. It is significant that the oxide plugs are not grown, but are deposited, leading to a device of improved reliability.

21. Thereafter, there is a source drive with oxidation, followed by a contact mask. Note that the sources are of short lateral extent and extend deep into the trench and primarily along gate oxide, not cap oxide.

22. These steps are followed by an SP⁺ implant and drive.

23. Following a premetal clean step, there is an FM sputter, metal mask and aluminum etch.

24. Standard finishing steps are then used, followed by a back metal (not shown) formed on the bottom of the N⁺ wafer 10.

Figure 6:
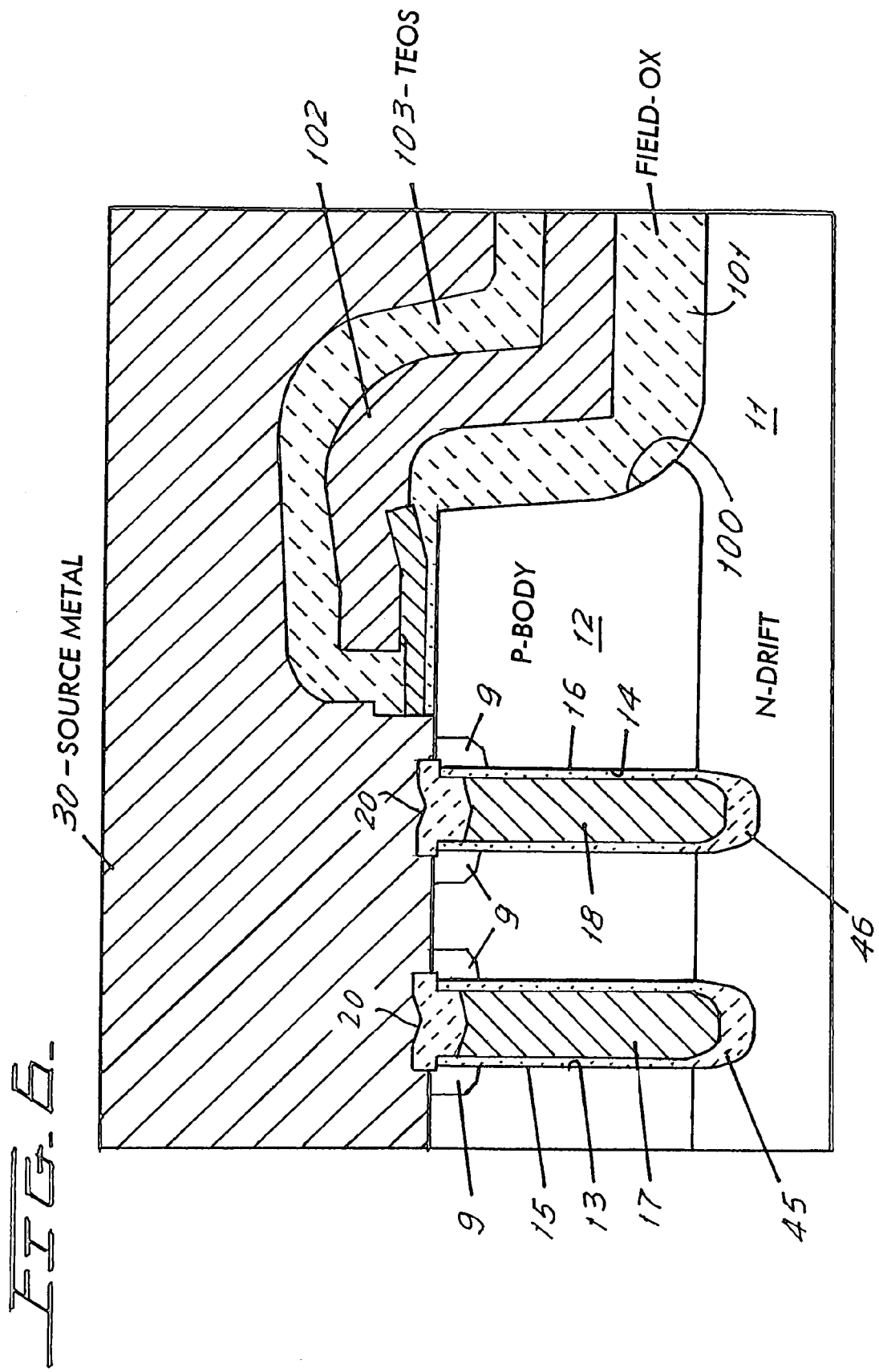
FIG. 6 is a cross-section of a modified termination structure for the device of FIG. 4.

FIG. 6 shows a modified termination (a trench termination) for the device of FIG. 4 and made by the foregoing process. In FIG. 6 components similar to those of FIG. 4 have the same identifying numeral.

It will be noted in FIG. 6 that the plugs 20 are clearly pulled back (steps 18 and 19) to provide a lateral source region contact surface to source metal 30. Further, the novel termination has a termination trench 100, formed at step 4 above, which is covered by field oxide 101, formed at step 7, a conductive polysilicon field plate 102, formed at steps 14 to 16, and the deposited TEOS layer 103 formed in step 20 above.

The novel structures of FIGS. 3, 4, 5 and 6 permits an increase in the trench cell density, and a reduction in channel length $L_{ch}$ for the same BV as compared to the prior art device of FIGS. 1 and 2 and a more compact channel structure.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A semiconductor device comprising:
   a semiconductor body of a first conductivity which includes a channel region of a second conductivity and a major surface;
   an active region formed in said semiconductor body, said active region including a plurality of spaced trenches extending through said channel region;
   a gate structure disposed in each said trench, each gate structure including a gate oxide layer disposed at least on sidewalls of a trench and a gate electrode disposed adjacent said gate oxide layer;
   conductive regions of said first conductivity formed in said channel region adjacent each said trench;
   highly doped contact regions of said second conductivity formed in said channel region each being laterally confined between two opposing conductive regions;
   a metallic contact in contact with said conductive regions and said highly doped contact regions; and
   a termination structure, said termination structure including,
   a termination trench having a slanted sidewall formed in said semiconductor body, and a grown field oxide layer formed in said termination trench below said major surface, a polysilicon field plate formed over said field oxide layer, and a low temperature oxide body over said polysilicon field plate, wherein said field oxide layer is thicker than said gate oxide layer, wherein said metallic contact extends over said low temperature oxide body, and wherein said semiconductor body of said first conductivity extends from said trench to the bottom of said termination trench.

2. A semiconductor device according to claim 1, wherein said trench includes an oxide mass formed at its bottom, said oxide mass being thicker than said gate oxide layer.

3. A semiconductor device according to claim 2, further comprising a semiconductor substrate of said first conductivity, said semiconductor body being formed over said semiconductor substrate, wherein said conductive regions are electrically connectable to said semiconductor substrate through invertible channels adjacent said trench.

4. A semiconductor device according to claim 3, wherein said conductive regions are source regions.

5. A semiconductor device according to claim 1, further comprising an oxide plug disposed over each gate electrode.

\* \* \* \* \*